United States Patent

Sabharwal

(10) Patent No.: US 6,711,092 B1
(45) Date of Patent: Mar. 23, 2004

(54) SEMICONDUCTOR MEMORY WITH MULTIPLE TIMING LOOPS

(75) Inventor: Deepak Sabharwal, Fremont, CA (US)

(73) Assignee: Virage Logic Corp., Fremont, CA (US)

(*) Notice: Subject to any disclaimer, the term of this patent is extended or adjusted under 35 U.S.C. 154(b) by 0 days.

(21) Appl. No.: 10/279,428

(22) Filed: Oct. 24, 2002

Related U.S. Application Data

(60) Provisional application No. 60/377,161, filed on Apr. 30, 2002.

(51) Int. Cl.[7] ............................................. G11C 8/00
(52) U.S. Cl. .................................. 365/233; 365/194
(58) Field of Search ................................ 365/233, 194, 365/230.06

(56) References Cited

U.S. PATENT DOCUMENTS 6,198,690 B1 * 3/2001 Kato et al. ................... 365/233
6,339,553 B1 * 1/2002 Kuge .......................... 365/194
6,603,687 B2 * 8/2003 Jun et al. ..................... 365/194

\* cited by examiner

*Primary Examiner*—Huan Hoang
(74) *Attorney, Agent, or Firm*—Danamraj & Youst, P.C.

(57) ABSTRACT

A semiconductor memory with multiple timing loops for optimizing memory access operations. A clock generator circuit is provided for generating an internal memory clock based on an external clock or an input signal transition supplied to the memory device. The internal memory clock is operable to provide a timing reference with respect to a memory access operation based on a plurality of address signals. A timing loop selector is operable to select a particular timing loop responsive to at least one access margin signal. A shutdown circuit generates an access shutdown signal based on the selected timing loop that is optimized for a memory device of particular size, speed, etc.

41 Claims, 8 Drawing Sheets

| AM3 | AM2 | AM1 | AM0 | LOOP DESCRIPTION |
|---|---|---|---|---|
| 0 | 0 | 0 | 0 | RBL WITH 2 PULLDOWNS |
| 0 | 0 | 0 | 1 | RBL WITH 4 PULLDOWNS |
| 0 | 0 | 1 | 0 | RBL WITH 6 PULLDOWNS |
| 0 | 0 | 1 | 1 | RBL WITH 8 PULLDOWNS |
| 0 | 1 | 0 | 0 | RBL WITH 10 PULLDOWNS |
| 0 | 1 | 0 | 1 | RBL WITH 12 PULLDOWNS |
| 0 | 1 | 1 | 0 | RBL WITH 14 PULLDOWNS |
| 0 | 1 | 1 | 1 | RBL WITH 16 PULLDOWNS |
| 1 | 0 | 0 | 0 | RWL WITH HORIZONTAL DELAY AND 2* FIXED DELAY |
| 1 | 0 | 0 | 1 | RWL WITH NO HORIZONTAL DELAY AND 2* FIXED DELAY |
| 1 | 0 | 1 | 0 | RWL WITH HORIZONTAL DELAY AND 1* FIXED DELAY |
| 1 | 0 | 1 | 1 | RWL WITH NO HORIZONTAL DELAY AND 1* FIXED DELAY |
| 1 | 1 | 0 | 0 | RWL WITH NO HORIZONTAL DELAY |
| 1 | 1 | 0 | 1 | CCLK + 3* DELAY |
| 1 | 1 | 1 | 0 | CCLK + 2* DELAY |
| 1 | 1 | 1 | 1 | CCLK + DELAY |
| | | | | CCLK |

FIG. 7

SEMICONDUCTOR MEMORY WITH MULTIPLE TIMING LOOPS

PRIORITY UNDER 35 U.S.C. §119(e) & 37 C.F.R. §1.78

This nonprovisional application claims priority based upon the following prior United States provisional patent application entitled: Semiconductor Memory With Multiple Timing Loops, Ser. No.: 60/377,161, filed Apr. 30, 2002, in the name(s) of: Deepak Sabharwal, which is hereby incorporated by reference for all purposes.

BACKGROUND OF THE INVENTION

1. Technical Field of the Invention

The present invention relates generally to semiconductor memories. More particularly, and not by way of any limitation, the present invention is directed to a system and method for providing multiple timing loops in a memory device with respect to access operatiorns therein.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of, circuitry that can be quickly inserted and verified to create a single-chip system. Such reusable IP components are typically provided as megacells, cores, macros, embedded memories through generators or memory compilers, et cetera.

It is well known that memory is a key technology driver for SOC design. It is also well known that performance parameters such as access time, overall memory cycle time, power consumption, et cetera, play a pivotal role in designing a memory. circuit, whether provided in an embedded SOC application or as a stand-alone device. These parameters can be critically dependent on the topology of a memory array. For high-speed memories, accordingly, it is desirable that these parameters such as access time are optimized regardless of the memory array sizes.

To achieve efficiency, access operations in most memories today are provided to be self-timed. That is, memory accesses typically require only a rising edge of an external clock signal, which is used to manufacture an internal memory clock that provides a time base for access operations. A shutdown signal is subsequently generated for effectuating access shutdown. Thus, in essence, a self-timed clock (STC) is imposed on the memory accesses.

Many techniques are available for generating the self-timed access clock in current memories. Regardless of the implementational variations, the basic concept remains the same: selecting a particular array wordline (WL) based on address signals specified for an access operation, monitoring array bitline(s) (BLs) to determine if they have discharged to a particular level, and turning off the WL at an appropriate time.

It should be appreciated that the conventional STC schemes are highly sensitive to the array sizes because the electrical characteristics—therefore, timing delays—are topology-dependent. As a consequence, while a specific STC arrangement may be satisfactory with respect to a memory device of particular size and aspect, it may be entirely inadequate for other memory sizes. This deficiency is especially exacerbated in compilable memories which, by definition, are capable of generating numerous memory instances having different array sizes, aspect ratios, and I/O configurations, thereby necessitating different delay paths to optimize access timing loops.

SUMMARY OF THE INVENTION

Accordingly, the present invention advantageously provides a semiconductor memory with multiple timing loops for optimizing memory access operations depending upon the array size. A clock generator circuit is provided for generating an internal memory clock based on an external clock or responsive to an input signal transition (e.g., address signal transition) supplied to the memory device. The internal memory clock is operable to provide a timing reference with respect to a memory access operation based on a plurality of address signals. A timing loop selector is operable to select a particular timing loop responsive to at least one or more control signals, referred to as Access Margin (AM) signals, which could be provided from an external source or may be provided as a hardwired option in the circuitry (e.g., as a metal layer option). A shutdown circuit generates an access shutdown signal based on the selected timing loop that is provided with a predetermined delay optimized for the memory's size, speed, aspect ratio, and other performance characteristics.

BRIEF DESCRIPTION OF THE DRAWINGS

A more complete understanding of the present invention may be had by reference to the following Detailed Description when taken in conjunction with the accompanying drawings wherein:

FIG. 7 is a logic table involving four Access Margin signals operable to effect a plurality of exemplary timing loop implementations;

DETAILED DESCRIPTION OF THE DRAWINGS

Figure 1:
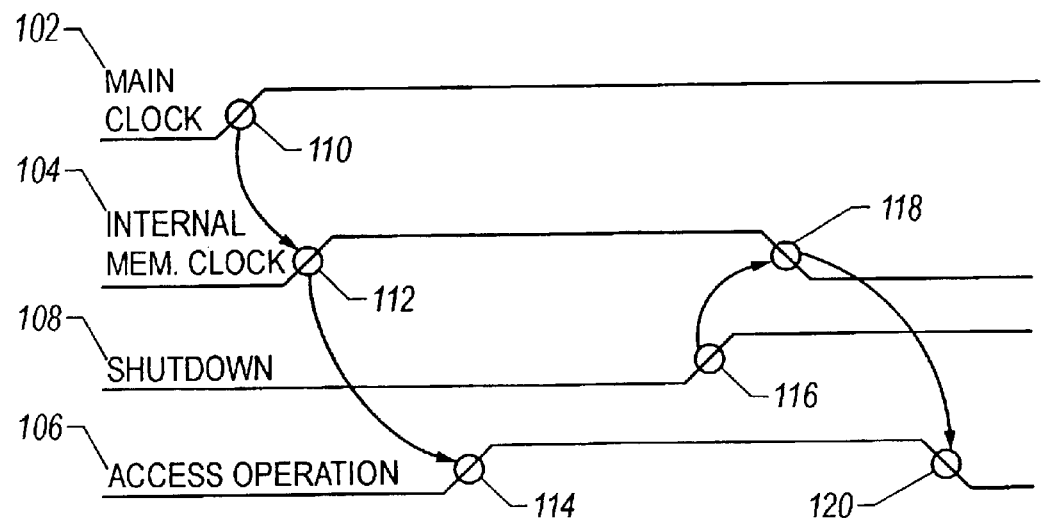
FIG. 1 depicts a generic timing diagram for a memory access operation wherein the teachings of the present invention may be advantageously practiced.

In the drawings, like or similar elements are designated with identical reference numerals throughout the several views thereof, and the various elements depicted are not necessarily drawn to scale. Referring now to FIG. 1, depicted therein is a generic timing diagram for a memory access operation wherein the teachings of the present invention may be advantageously practiced. As is well known in the memory design art, an external clock 102, also referred to as main clock or system clock, is provided to an exemplary semiconductor memory device for coordinating its various memory operations. In this sense, the external clock 102 provides a time base that operates as a system-level timing reference for the memory device. To effectuate self-timed access capability, which is common in most high performance memories, an internal memory clock is typically generated based on the external clock. Reference numeral 104 refers to an exemplary internal clock manufactured by the memory device, which is used for providing a timing loop for access operations. In one implementation, a rising edge 110 in the external clock 102 may be used for generating a rising edge 112 in the internal memory clock 102, which rising edge 112 is operable to synchronize a memory access timing loop. Reference numeral 106 refers to a signal symbolically denoting an exemplary access operation, wherein a rising edge 114 is indicative of an activated state of the access operation. Based on the particular timing loop provided in the memory device, a shutdown signal 108 is asserted (as exemplified by its rising edge 116) after a predetermined delay. Depending upon the implementation, the internal memory clock 104 is deactivated thereafter (as exemplified by its falling edge 118), which in turn completes the access operation (as exemplified by the falling edge 120).

Those skilled in the art should readily appreciate that the generic timing diagram set forth hereinabove is provided for purposes of illustrating the high-level principles involved in self-timed memory access operations in general, rather than describing any particular implementation. Also, as a generic memory access process, both read access operations and write access operations are comprehended herein. Accordingly, although specific details such as decoded address signals, selected wordline (WL) and bitline (BL) signals, read/write enable signals, Chip Select (CS) and Bank Select (BS) signals (if implemented), sense amplifier and data in/out signals, et cetera, are not shown in the timing diagram of FIG. 1, it should be recognized that such signals are nevertheless are typically necessary in effectuating actual memory access operations.

As pointed out in the Background section of the present patent application, conventional memory implementations provide for only one timing loop, which may be sufficient for standalone devices because of their fixed array sizes. However, compilable memory arrangements capable of supporting different array sizes and I/O configurations may not be optimally timed because the variable aspect ratios typically require adjustable timing loops.

Figure 2:
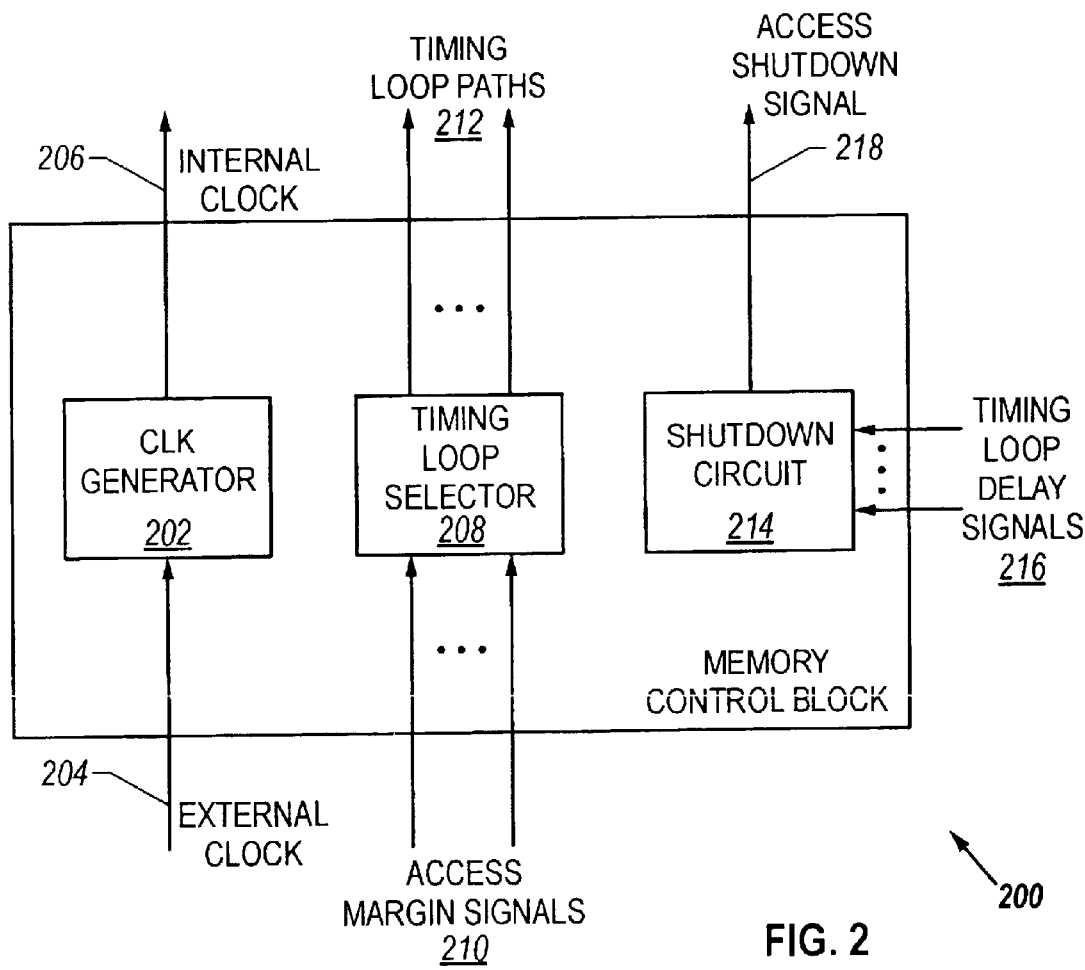
FIG. 2 depicts a high-level functional block diagram of a control block associated with a semiconductor memory, which control block includes circuitry for selecting multiple timing loops and circuitry for generating an access shutdown signal based thereon.

FIG. 2 depicts a high-level functional block diagram of an exemplary control block 200 associated with a semiconductor memory (not shown), which control block 200 includes circuitry provided in accordance with the teachings of the present invention for effectuating multiple timing loops. A clock generator circuit block 202 is operable to generate an internal memory clock 206 based on an external clock 204. A timing loop selector 208 operating to receive a plurality of Access Margin (AM) signals is provided for generating one of a plurality of timing loop path signals 212. As will be described in greater detail hereinbelow, a particular timing loop path signal is selectable based on the AM signals' logic. Furthermore, the selected timing loop path signal is operable to effectuate a corresponding timing loop in connection with a memory access operation. A shutdown circuit 214 is operable to receive an appropriate timing loop delay signal 216 associated with the selected timing loop after a predetermined sequence of delays and/or events relating to the timing loop takes place. Responsive to the timing loop delay signals 216, which may be thought of as "timing loopback" signals since these signals are generated with a predetermined time delay that is optimized for a particular array size and injected into the selected timing loop, the shutdown circuit 214 generates an access shutdown signal 218 for completing the access operation.

Figure 3:
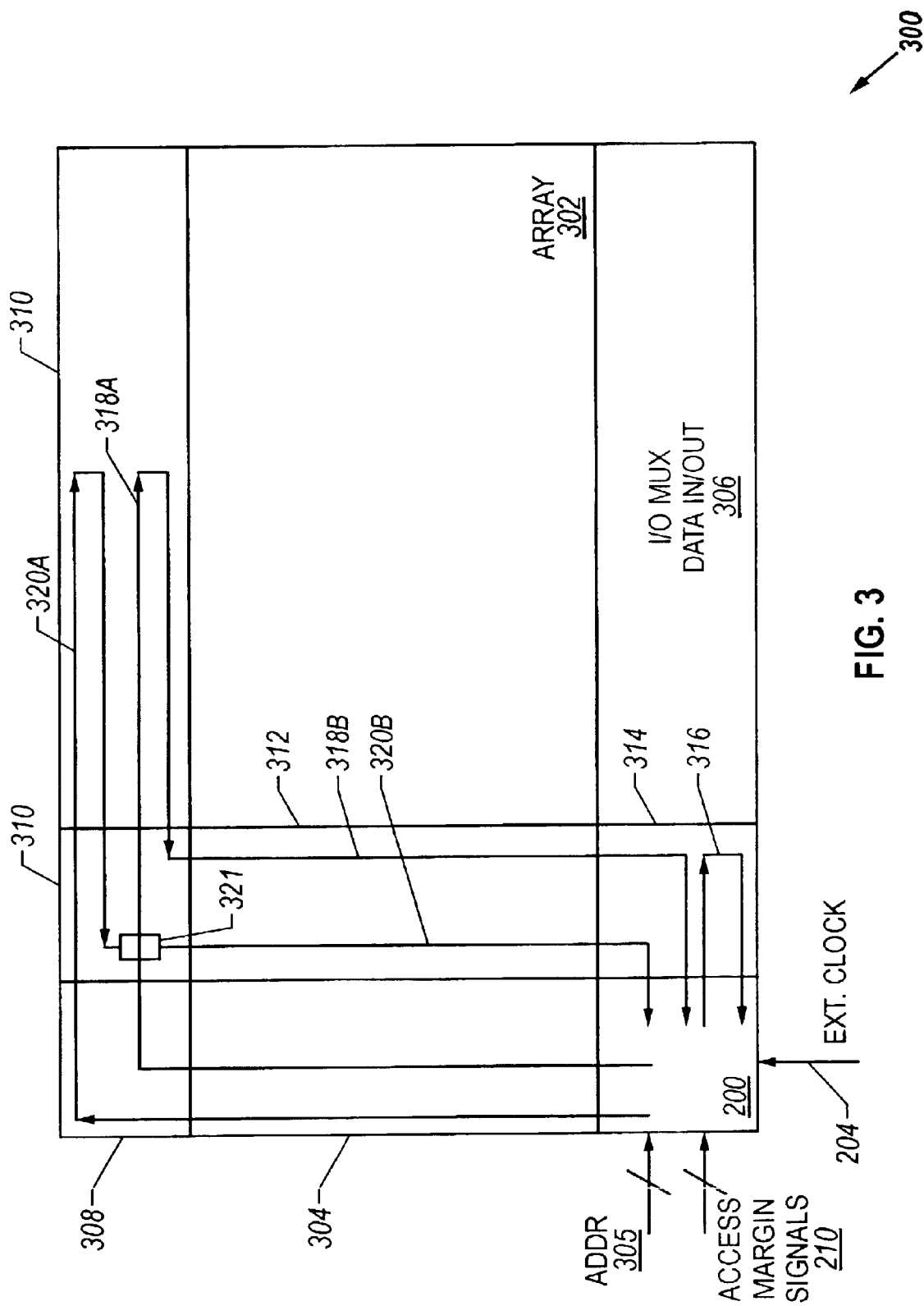
FIG. 3 depicts a physical layout of an exemplary semiconductor memory device wherein a plurality of access timing loops are provided in accordance with the teachings of the present invention.

Referring now to FIG. 3, depicted therein is an exemplary compilable semiconductor memory device 300 with a plurality of access timing loops provided in accordance with the teachings of the present invention. The memory device or instance 300 may be comprised of any known or heretofore unknown architecture and technology, and may be selected from the group including static random access memory (SRAM) instances, dynamic RAM (DRAM) instances, electrically programmable read-only memory (EPROM) instances, Flash memory instances, and the like. A core array 302 of predetermined size is provided with a control block, such as control block 200 described above, a row decoder (XDEC) 304, and a block of circuitry 306 responsible for I/O MUX and Data In/Out.

In order to effectuate multiple timing loops, the memory instance 300 is provided with a plurality of reference circuit blocks operable to implement different timing loop configurations and delays. A reference XDEC block 308 is provided for decoding a particular reference WL (RWL) that is operable to follow a core array WL in its electrical and timing characteristics. A reference WL block 311 including a number of RWLs with different loopbacks (hence delays) is provided as part of the multi-loop mechanism of the present invention. A reference cell block 310 and associated reference BL (RBL) block 312 are provided for effectuating another set of timing loops that follow not only the delays associated with core array WLs, but also whatever delays relating to signal development on core BLs that occur upon accessing core array cells. Another circuit block 314 is provided for effectuating much shorter timing loops having a predetermined number of inverter stages, but without any WL- and BL-related delays.

Continuing to refer to FIG. 3, reference numeral 305 refers to a plurality of address signals provided to the memory instance 300 with respect to a memory access operation. Reference numeral 316 refers to a family of timing loops having no more than a predetermined number of inverter delays, wherein each of the timing loops can be selected based on the logic levels of the AM signals 210. Because no additional delay events (e.g., WL and/or BL delays) are tracked, the timing loops 316 are usually the fastest, and may be used advantageously with smaller memory sizes.

As those skilled in the art should appreciate, the effects of actual WL turn-on delays as well as BL discharge delays can play a dominant role in determining the overall access cycle time in larger memories. Accordingly, the present invention also provides for timing loops that take into account such delays. A timing loop family that. tracks the WL turnon delay is exemplified by an RWL loopback path 318A and a column track portion 318B. The RWL loopback path 318A is "adjustable" in the sense that different horizontal delays may be implemented to suit variable widths of an array. A selected RWL is driven HIGH and looped back via RWL path 318A and column track 318B to the shutdown circuitry of the control block 200 in order to generateda shutdown signal.

Another family of timing loops accounting for WL delays as well as BL delays is exemplified by an adjustable RWL loopback path 320A and an adjustable RBL delay portion 320B. Upon looping back, the selected RWL is operable to turn on one or more reference memory cells in series in reference cell block 310, which in turn activate the RBL path 320B associated therewith. Thus the reference cells are operable as selectable puildown stages to track different BL discharge rates. Thereafter, the RBL path signal is provided to the shutdown circuitry as a timing loop delay signal for generating an access shutdown signal.

Figure 4:
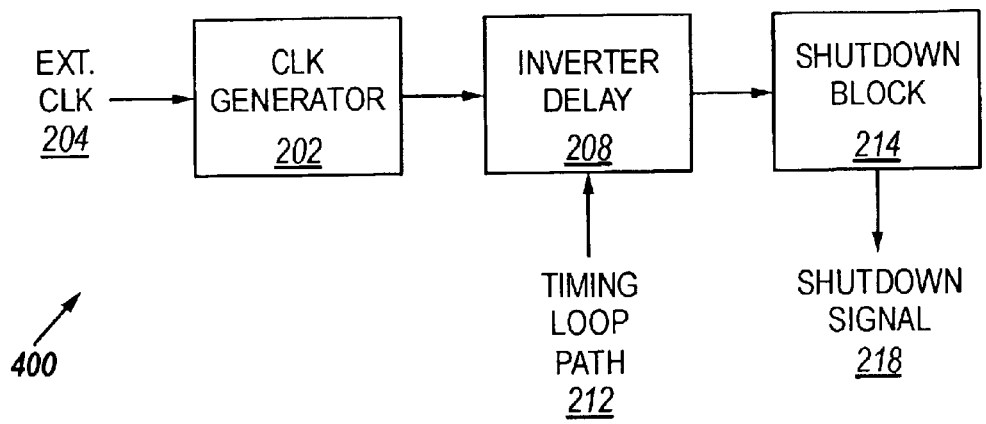
FIG. 4 depicts a functional block diagram of circuitry operable to effectuate a first timing loop family in an exemplary semiconductor memory.
Figure 5:
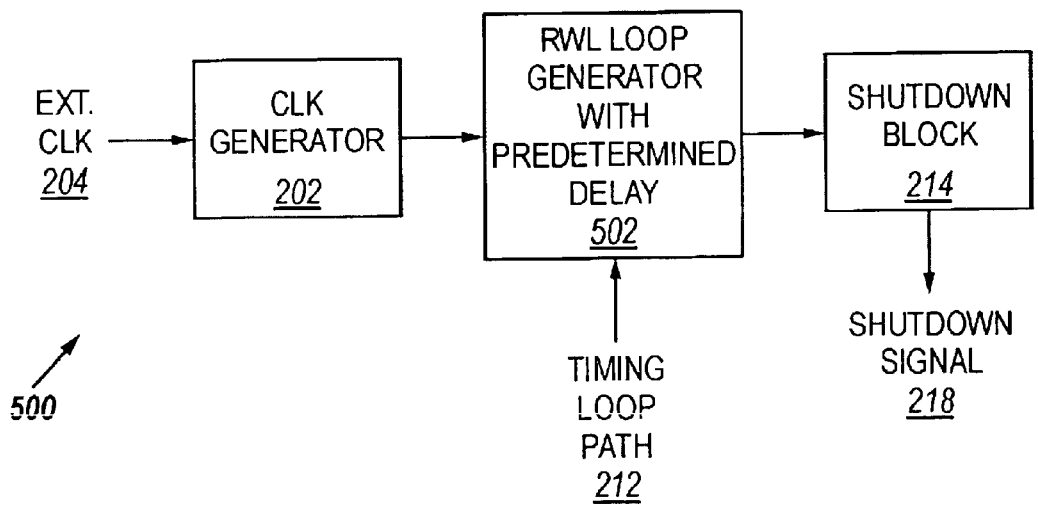
FIG. 5 depicts a functional block diagram of circuitry operable to effectuate a second timing loop family in an exemplary semiconductor memory.
Figure 6:
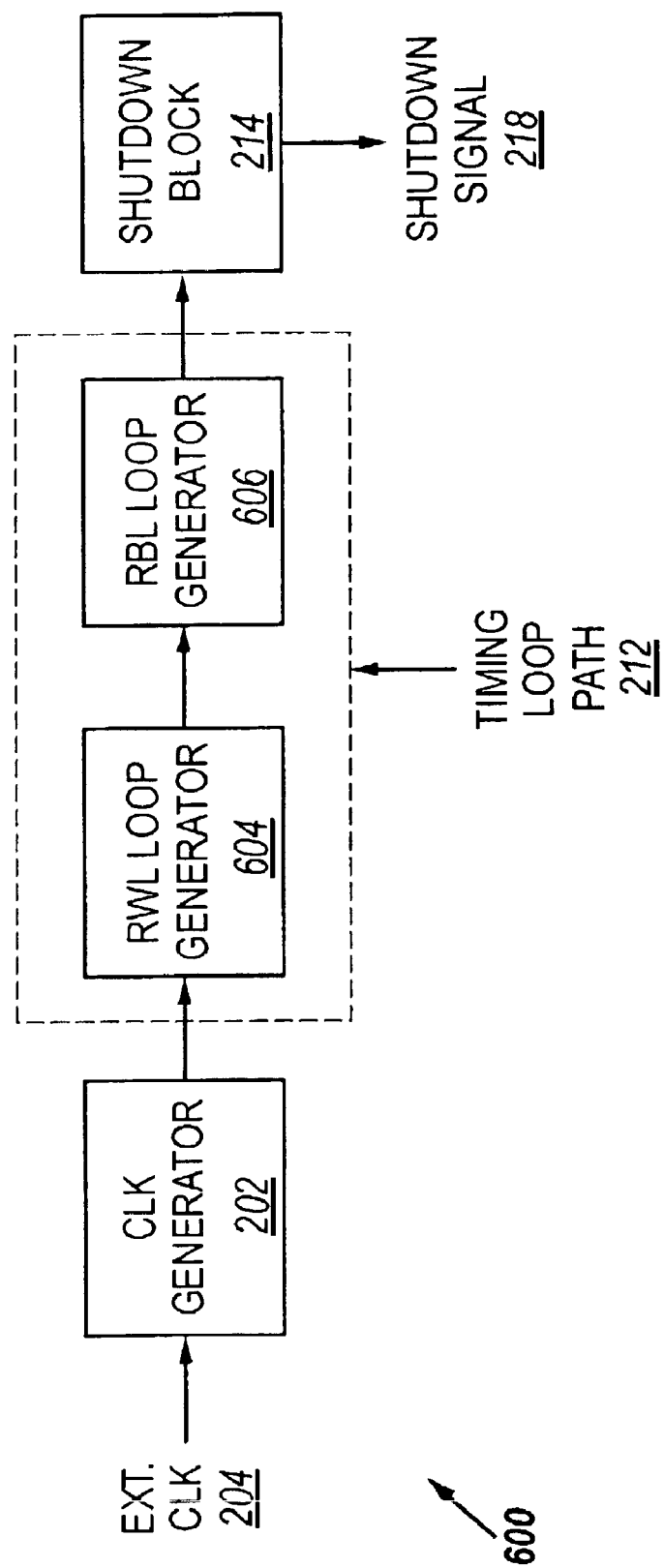
FIG. 6 depicts a functional block diagram of circuitry operable to effectuate a third timing loop family in an exemplary semiconductor memory.

FIGS. 4–6 respectively depict three functional block diagrams of the circuitry operable to generate the three families of timing loops described above. In particular, the functional block diagram of FIG. 4 is representative of the circuitry 400 for effectuating the timing loop family with shortest delays, i.e., fastest loops, for use with smaller memories. As pointed out in the foregoing discussion, internal memory clock generator 202 is operable responsive to external clock 204 to manufacture an internal memory clock (CCLK) that sets forth a timing reference for self-timed memory access operations. Based on selected timing loop path signal 212 (provided by the timing loop selector circuitry responsive to the AM signals), an inverter delay block 402 is operable to delay the internal clock for a predetermined amount of delay. Since the delay is selectable, in some implementations a "no delay" path may be provided also. The internal clock with predetermined delay or no delay is provided as the timing loopback signal to the shutdown block 214 that generates an appropriate shutdown signal 218 to turn off the selected core WL.

The functional block diagram of FIG. 5 is representative of the circuitry 500 for effectuating a timing loop family with moderate delays that account for the WL turn-on delays. As before, the internal memory clock generated by clock generator circuit 202 responsive to external clock 204 provides the time base for the access operations. Responsive at least in part to the selected timing loop path signal 212, an adjustable RWL loop generator 50,2 drives a selected RWL HIGH, with a predetermined horizontal delay as well as with one or more fixed delay stages. The "HIGH" transition on the RWL spans the loop back portion and is propagated down a column track that is preferably provided with a capacitance substantially similar to that of a regular core BL. The propagated RWL transition is provided as the timing loopback signal to the shutdown block 214, which in turn generates an appropriate shutdown signal 218 to shut off the self-timed access cycle.

The combined delay associated with WL turn-on and BL discharge is tracked by the circuitry 600 represented by the block diagram of FIG. 6, which provides for longest timing loops suitable with larger arrays having "tall" aspects. Accordingly, delay generator block 602 includes an RWL loop generator 604 that drives HIGH an RWL that has been decoded by the reference XDEC block and an RBL loop generator 606 (involving one or more reference memory cell) that is operable to pull the RBL signal LOW. The "LOW" transition on the RBL is propagated as the timing loopback signal to the shutdown block 214, which provides the appropriate shutdown signal 218. It should be apparent that the RWL and RBL loop generators may be provided with separate predetermined delay stages which can be used to optimize the timing loops for different memory sizes.

Referring now to FIG. 7, depicted therein is logic table 700 involving four AM signals, AM[0:3], operable to effectuate a plurality of timing loop implementations in a presently preferred exemplary embodiment of the present invention. Reference numeral 702 refers to the timing loop family (having four specific implementations) with shortest delays. For instance, with the logic levels of AM0=AM1=AM2=AM3=1, no delay is introduced in the internal memory clock, thereby obtaining the fastest timing loopback path. With the logic levels of AM0=0 and AM1=AM2=AM3=1, a single delay stage having predetermined delay is introduced. Reference numeral 704 refers to the timing loop family (with four implementations) having moderate delays. Likewise, reference numeral 706 refers to the set of longest timing loops involving the RBL discharge path. By selecting appropriate logic levels on the AM signals, different rates of BL discharge may be simulated with a suitable number of pulldown cells coupled to the RBLs. By way of illustration, with the logic levels of AM0=AM1=AM2=AM3=0, an RBL time delay path with two pulldown cells (i.e., slowest discharge) can be implemented. In similar fashion, an RBL time delay path with 16 pulldown cells (fastest discharge rate) can be selected with the logic levels of AM3=0 and AM0=AM1=AM2=1.

Figure 8A:
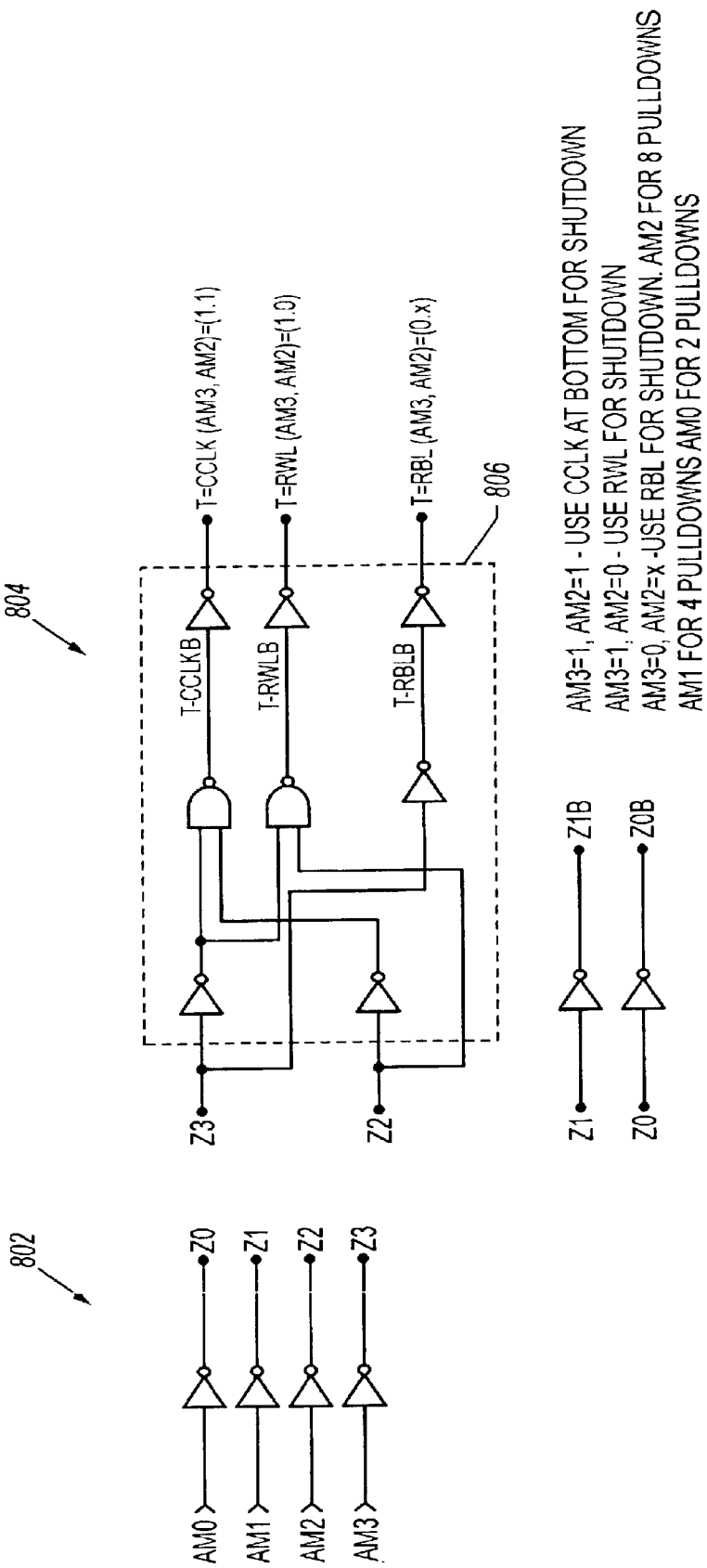
FIGS. 8A and 8B depict exemplary timing loop selector circuits implementing the logic table of FIG. 7.
Figure 8B:
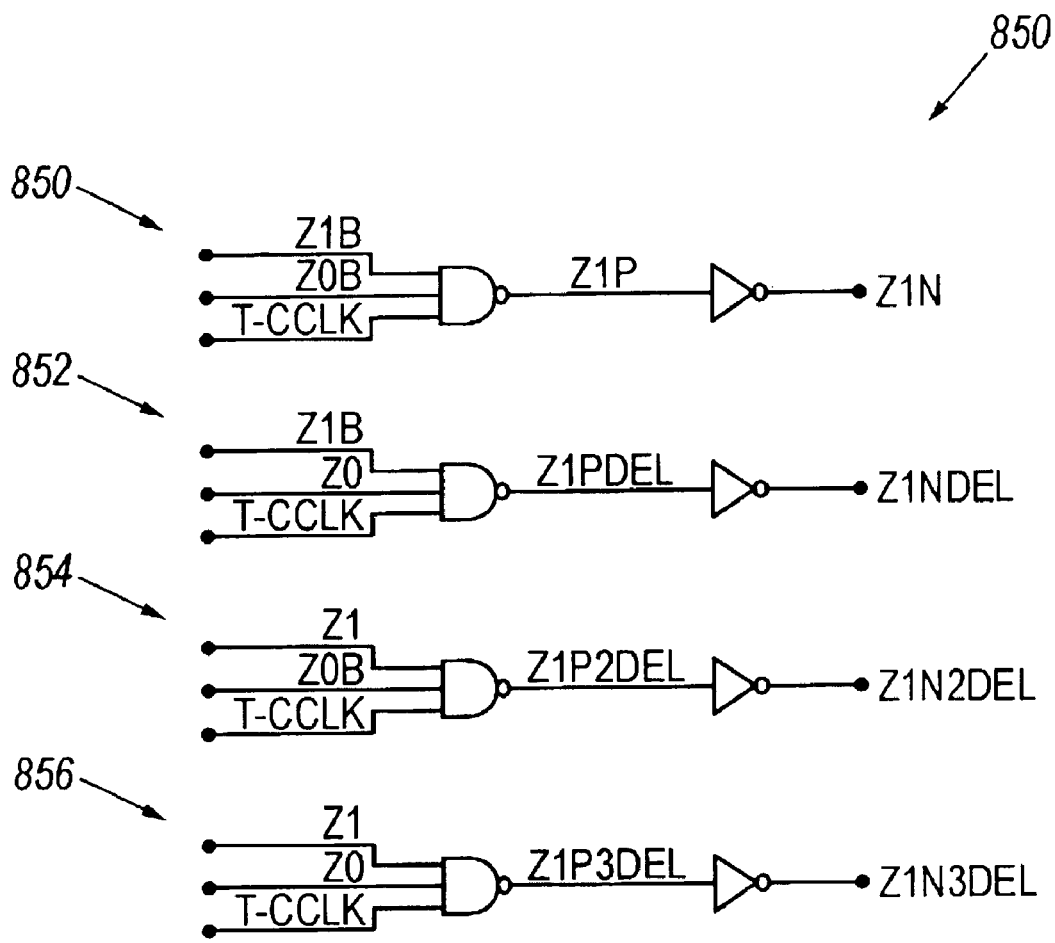

One skilled in the art should recognize upon having reference hereto that numerous circuit implementations are possible for realizing the logic table 700 as part of the timing loop selector circuitry alluded to hereinabove. FIGS. 8A and 8B depict exemplary circuit embodiments for providing such functionality. In particular, FIG. 8A depicts circuit portions operable to select the three timing loop families described in detail hereinabove. Reference numeral 802 refers to a circuit portion provided as an initial stage of the circuitry. Each AM signal is provided to an inverter, whereby a plurality of intermediate signals, referred to as Z[0:3] signals, are generated. Reference numeral 804 refers to a circuit portion provided as a follow-on stage of the timing loop selector logic. Whereas Z0 and Z1 signals are simply inverted to generate Z0B and Z1B signals, respectively, Z2 and Z3 signals are provided to a logic block 806 used to manufacture three control signals, T_RBL, T_RWL and T_CCLK. As shown in the FIG., the T_CCLK signal is generated when AM3=AM2=1, which signal is used for selecting the timing loop family with shortest delays (the CCLK family). Similarly, the T_RWL signal is generated when AM3=1 and AM2=0, which signal is operable to select the RWL loop family. The T_RBL signal is generated with AM3=0 and AM2=X (i.e., "don't care") for selecting the RBL loop family.

FIG. 8B depicts exemplary circuit embodiments for selecting each individual timing loop of the CCLK family. Reference numeral 850 refers to a logic block that uses Z1B, Z0B and T_CCLK signals to generate Z1N signal which is operable to effectuate the shortest timing loop, i.e., the loop with no delay stage. Reference numeral 852 refers to a logic block that uses Z1B, Z0 and T_CCLK signals to generate Z1NDEL signal which is operable to effectuate a timing loop with one delay stage. Likewise, reference numerals 854 and 856 refer to logic blocks that use Z1, Z0B and T_CCLK signals and Z1, Z0 and T_CCLK signals, respectively, to generate Z2NDEL and Z3NDEL signals. The timing loops with two delay stages and three delay stages are effectuated by Z2NDEL and Z3NDEL signals, respectively. Those skilled in the art should recognize upon having reference hereto that similar logic circuits may be provided for the RWL and RBL timing loop families with respect to individual timing loop selection.

Figure 9:
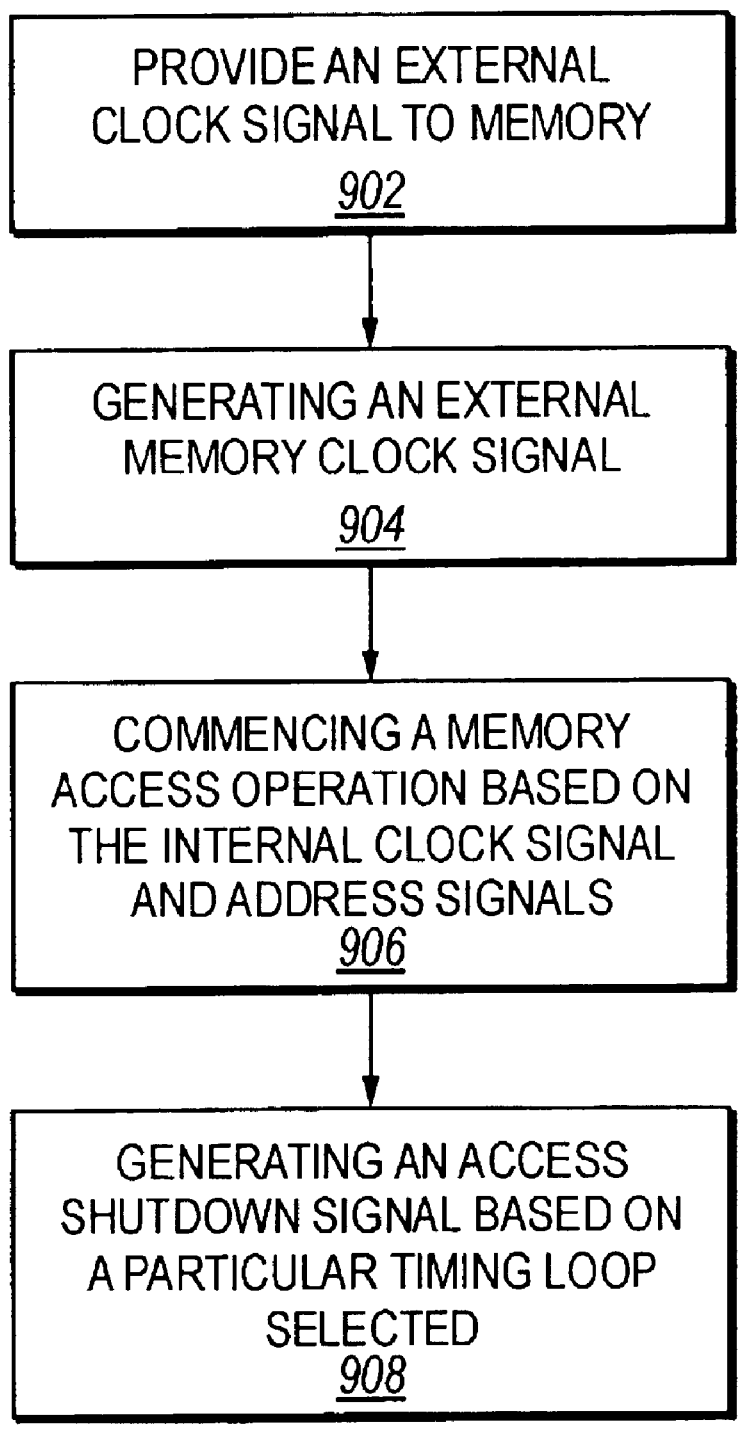
FIG. 9 is a flow chart of the steps involved in an exemplary methodology for effectuating an access timing loop in a semiconductor memory in accordance with the teachings of the present invention.

Referring now to FIG. 9, shown therein is a flow chart of the various steps involved in an exemplary methodology for effectuating an access timing loop in a semiconductor memory in accordance with the teachings of the present invention. Upon providing an external clock signal to the memory (stop 902), an internal memory clock signal is generated that provides a timing reference with respect to a self-timed access operation of the memory (step 904). Based at least in part on the internal clock signal and a plurality of addresses, a memory access operation is commenced thereafter (step 906). An access shutdown signal is generated as part of the self-timing access cycle, which shutdown signal is based on a particular timing loop selected (step 908). As pointed out before, the selection of a particular timing loop is controlled by at least one AM signal operable to actuate appropriate timing loop selector logic.

Based on the foregoing, it should be appreciated that the present invention advantageously provides a simple yet efficient and elegant timing loop scheme that optimizes the timing for memory access operations based on selectable loop delay. With a relatively small number of control signals (i.e., AM signals), numerous timing loops with adjustable delay can be implemented to suit a particular memory.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although the teachings of the present invention have been particularly described by way of a compilable memory, those skilled in the art should recognize that the underlying concepts can be advantageously implemented in standalone memory devices also. Additionally, the teachings of the present invention can be practiced with different types of memory instances, e.g., SRAM instances, DRAM instances, ROM/EPROM/EEPROM instances, Flash memory instances, embedded SOC devices, and the like. Moreover, the compilable memory arrays themselves may include any known architecture, including banking, divided wordlines, for example, with the RBL and RWL blocks and reference bitcell blocks provided in any physical layout with respect to the core array. In further embodiments, the clock generator circuit of a memory may be operable to generate an internal memory clock in response to an input signal transition (e.g., address signal transition), rather than an external clock signal. Further, the AM signals may be provided from an external source or may be incorporated as a hardwired option (e.g., as a metal layer option). Accordingly, all such modifications, substitutions, extensions, additions, combinations, ,et cetera, should be considered to be within the ambit of the present invention whose scope is limited solely by the claims appended hereinbelow.

What is claimed is:

1. A method of effectuating an access timing loop in a semiconductor memory, comprising the steps:
   generating an internal memory clock based on, at least one of an external clock and an input signal transition;
   commencing a memory access operation responsive to said internal memory clock and a plurality of address signals; and
   generating an access shutdown signal based on a selected particular timing loop in said semiconductor memory, wherein said selected particular timing loop is operable to be selected responsive to at least one access margin signal.

2. The method of effectuating an access timing loop in a semiconductor memory as set forth in claim 1, wherein said memory access operation comprises a read operation.

3. The method of effectuating an access timing loop in a semiconductor memory as set forth in claim 1, wherein said memory access operation comprises a write operation.

4. The method of effectuating an access timing loop in a semiconductor memory as set forth in claim 1, wherein said particular timing loop involves a fixed delay path between said internal memory clock and said access shutdown signal, said fixed delay path including at least one inverter having a predetermined propagation delay.

5. The method of effectuating an access timing loop in a semiconductor memory as set forth in claim 1, wherein said at least one access margin signal is provided via a hardwired option.

6. The method of effectuating an access timing loop in a semiconductor memory as set forth in claim 1, wherein said particular timing loop involves a reference wordline (RWL) path operable to propagate an RWL signal, said access shutdown signal being generated based on said RWL signal being asserted.

7. The method of effectuating an access timing loop in a semiconductor memory as set forth in claim 6, wherein said access shutdown signal is generated after a predetermined horizontal delay follows upon said RWL signal being asserted.

8. The method of effectuating an access timing loop in a semiconductor memory as set forth in claim 7, wherein said predetermined horizontal delay is substantially zero.

9. The method of effectuating an access timing loop in a semiconductor memory as set forth in claim 6, wherein said access shutdown signal is generated after a predetermined horizontal delay and a predetermined fixed delay follow upon said RWL signal being asserted.

10. The method of effectuating an access timing loop in a semiconductor memory as set forth in claim 1, wherein said particular timing loop involves a reference wordline (RWL) path operable to propagate an RWL signal and a reference bitline (RBL) path operable to propagate an RBL signal, said access shutdown signal being generated based on said RBL signal being asserted.

11. The method of effectuating an access timing loop in a semiconductor memory as set forth in claim 10, wherein said RBL signal is driven LOW based on said RWL signal being asserted.

12. The method of effectuating an access timing loop in a semiconductor memory as set forth in claim 11, wherein said RBL signal is asserted with a predetermined number of pulldown cells.

13. The method of effectuating an access timing loop in a semiconductor memory as set forth in claim 1, wherein said at least one access margin signal includes access margin signals provided from an external source.

14. The method of effectuating.an access timing loop in a semiconductor memory as set forth in claim 1, wherein said selected particular timing loop is selected based on said semiconductor memory's performance requirements.

15. A semiconductor memory, comprising:
   means to generate an internal memory clock based on one of an external clock supplied thereto and an input signal transition, said internal memory clock for providing a timing reference for a memory access operation;
   means to commence said memory access operation based on a plurality of address signals;
   means to select a particular timing loop based on a plurality of access margin signals; and
   means to generate an access shutdown signal based on a selected timing loop.

16. The semiconductor memory as set forth in claim 15, wherein said memory access operation comprises a write operation.

17. The semiconductor memory as set forth in claim 15, wherein said memory access operation comprises a read operation.

18. The semiconductor memory as set forth in claim 15, wherein said particular timing loop involves a fixed delay path between said internal memory clock and said access shutdown signal, said fixed delay path having a predetermined propagation delay.

19. The semiconductor memory as set forth in claim 15, wherein said access margin signals are provided by an external source.

20. The semiconductor memory as set forth in claim 15, wherein said particular timing loop involves a reference wordline (RWL) path operable to propagate an RWL signal, said access shutdown signal being generated based on said RWL signal being asserted.

21. The semiconductor memory as set forth in claim 20, wherein said access shutdown signal is generated after a predetermined horizontal delay follows upon said RWL signal being asserted.

22. The semiconductor memory as set forth in claim 21, wherein said predetermined horizontal delay is substantially zero.

23. The semiconductor memory as set forth in claim 20, wherein said access shutdown signal is generated after a predetermined horizontal delay and a predetermined fixed delay follow upon said RWL signal being asserted.

24. The semiconductor memory as set forth in claim 15, wherein said particular timing loop involves a reference wordline (RWL) path operable to propagate an RWL signal and a reference bitline (RBL) path operable to propagate an RBL signal, said access shutdown signal being generated based on said RBL signal being asserted.

25. The semiconductor memory as set forth in claim 24, wherein said RBL signal is asserted based on asserting said RWL signal.

26. The semiconductor memory as set forth in claim 25, wherein said RBL signal is asserted with a predetermined number of pulldown cells.

27. The semiconductor memory as set forth in claim 15, wherein said access margin signals are provided via a hardwired option.

28. The semiconductor memory as set forth in claim 27, wherein said plurality of access margin signals are provided via a hardwired option.

29. The semiconductor memory as set forth in claim 15, wherein said selected timing loop is selected based on said semiconductor memory's performance requirements.

30. A semiconductor memory, comprising:
   a clock generator circuit operable to generate an internal memory clock based on one of an external clock supplied thereto and an input signal transition, said internal memory clock for providing a timing reference with respect to a memory access operation;
   a timing loop selector circuit operable to select a particular timing loop responsive to a plurality of access margin signals based on said semiconductor memory's performance requirements; and
   a shutdown circuit to generate an access shutdown signal responsive to a selected timing loop.

31. The semiconductor memory as set forth, in claim 30, wherein said memory access operation comprises a write operation.

32. The semiconductor memory as set forth in claim 30, wherein said memory access operation comprises a read operation.

33. The semiconductor memory as set forth in claim 30, wherein said particular timing loop involves a fixed delay path between said internal memory clock and said access shutdown signal, said fixed delay path having a predetermined propagation delay.

34. The semiconductor memory as set forth in claim 30, wherein said plurality of access margin signals are provided from an external source.

35. The semiconductor memory as set forth in claim 30, wherein said particular timing loop involves a reference wordline (RWL) path operable to propagate an RWL signal, said access shutdown signal being generated based on said RWL signal being asserted.

36. The semiconductor memory as set forth in claim 35, wherein said access shutdown signal is generated after a predetermined horizontal delay follows upon said RWL signal being asserted.

37. The semiconductor memory as set forth in claim 36, wherein said predetermined horizontal delay is substantially zero.

38. The semiconductor memory as set forth in claim 35, wherein said access shutdown signal is generated after a predetermined horizontal delay and a predetermined fixed delay follow upon said RWL signal being asserted.

39. The semiconductor memory as set forth in claim 30, wherein said particular timing loop involves a reference wordline (RWL) path operable to propagate an RWL signal and a reference bitline (RBL) path operable to propagate an RBL signal, said access shutdown signal being generated based on said RBL signal being asserted.

40. The semiconductor memory as set forth in claim 39, wherein said RBL signal is asserted based on asserting said RWL signal.

41. The semiconductor memory as set forth in claim 40, wherein said RBL signal is asserted with a predetermined number of pulldown cells.

* * * * *